US009246042B2

(12) United States Patent
Schaarschmidt et al.

(10) Patent No.: US 9,246,042 B2
(45) Date of Patent: Jan. 26, 2016

(54) METHOD FOR CONTACTING AND CONNECTING SOLAR CELLS

(71) Applicant: SolarWorld Innovations GmbH, Freiberg (DE)

(72) Inventors: Matthias Schaarschmidt, Limbach-Oberfrohna (DE); Thilo Richter, Limbach-Oberfrohna (DE); Wolfgang Enger, Chemnitz (DE); Thomas Seidel, Hartmannsdorf (DE); Paul Grunow, Berlin (DE); Martin Kutzer, Penig (DE); Olaf Storbeck, Dresden (DE); Holger Neuhaus, Freiberg (DE); Matthias Georgi, Dresden (DE)

(73) Assignee: SolarWorld Innovations GmbH, Freiberg (DE)

( * ) Notice: Subject to any disclaimer, the term of this patent is extended or adjusted under 35 U.S.C. 154(b) by 0 days.

(21) Appl. No.: 13/687,527

(22) Filed: Nov. 28, 2012

(65) Prior Publication Data
US 2013/0183789 A1    Jul. 18, 2013

Related U.S. Application Data

(63) Continuation of application No. PCT/DE2010/075044, filed on May 28, 2010.

(51) Int. Cl.
*H01L 31/18* (2006.01)
*H01L 31/05* (2014.01)

(52) U.S. Cl.
CPC ............ *H01L 31/18* (2013.01); *H01L 31/0508* (2013.01); *Y02E 10/50* (2013.01)

(58) Field of Classification Search
CPC ...................................................... H01L 31/18
USPC ........................................................ 438/67, 98
See application file for complete search history.

(56) References Cited

U.S. PATENT DOCUMENTS 4,525,594 A   6/1985  Pschunder
4,617,722 A  10/1986  Willis
(Continued)

FOREIGN PATENT DOCUMENTS

DE   298 05 805 U1   8/1998
DE   102 39 845 C1   12/2003
(Continued)

OTHER PUBLICATIONS

International Search Report dated Mar. 9, 2011 with English language translation (four (4) pages).
(Continued)

*Primary Examiner* — Christine Enad
(74) *Attorney, Agent, or Firm* — Maginot, Moore & Beck LLP

(57) ABSTRACT

A method for contacting and connecting solar cells, according to which at least one electrode is formed by at least one wire conductor, and including the following steps:
 positioning a continuous wire conductor so that the continuous wire conductor extends across a plurality of solar cells,
 interrupting the electrodes at the positions required for the connection, and
 contacting the solar cells and electrodes.

12 Claims, 13 Drawing Sheets

(56) References Cited

U.S. PATENT DOCUMENTS

| | | | |
|---|---|---|---|
| 5,158,618 A | 10/1992 | Rubin et al. | |
| 7,432,438 B2 | 10/2008 | Rubin et al. | |
| 8,013,239 B2 | 9/2011 | Rubin et al. | |
| 2005/0000561 A1* | 1/2005 | Baret et al. | 136/244 |
| 2009/0194144 A1* | 8/2009 | Taira et al. | 136/244 |
| 2010/0170555 A1 | 7/2010 | Rechid | |

FOREIGN PATENT DOCUMENTS

| | | |
|---|---|---|
| DE | 10 2006 041 046 A1 | 3/2008 |
| DE | 10 2007 022 877 A1 | 11/2008 |
| EP | 0 115 803 A2 | 8/1984 |
| EP | 0 440 869 A1 | 8/1991 |
| FR | 2 838 239 A1 | 10/2003 |
| JP | 59-115576 A | 7/1984 |
| JP | 62-500975 A | 4/1987 |
| JP | 11-103078 A | 4/1999 |
| JP | 2004-247402 A | 9/2004 |
| JP | 2009-260202 A | 11/2009 |

OTHER PUBLICATIONS

English translation of Japanese Office Action dated Jan. 14, 2014 (three (3) pages).

* cited by examiner

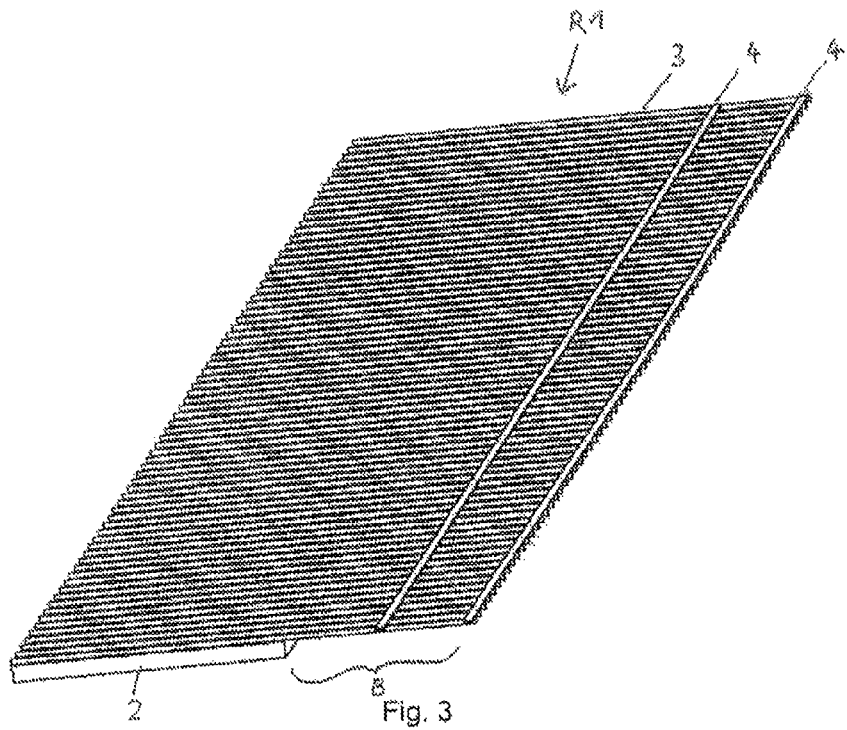
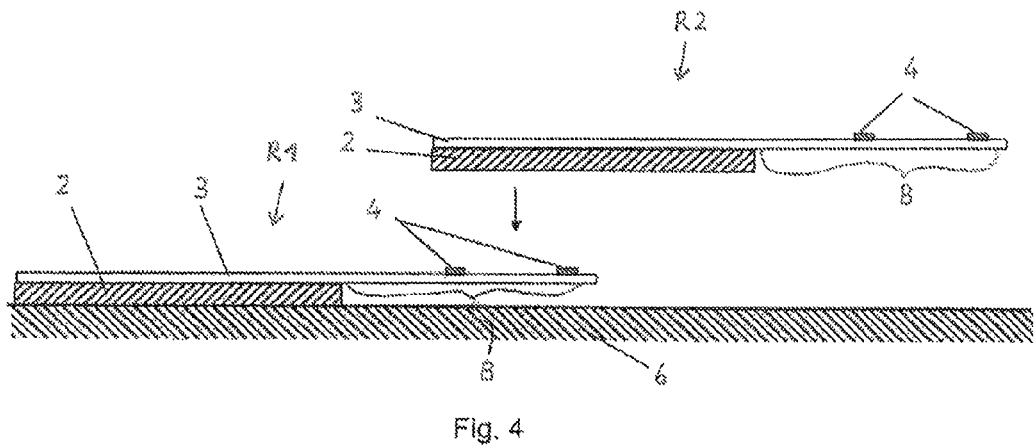
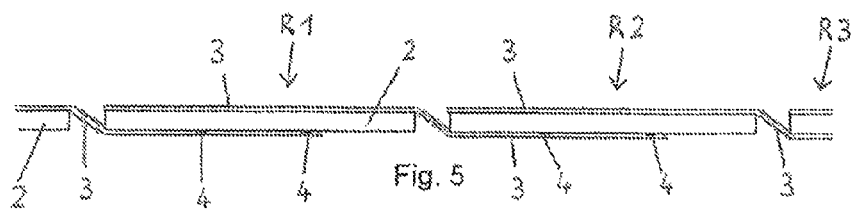

TRANSVERSE DIRECTION

LONGITUDINAL DIRECTION

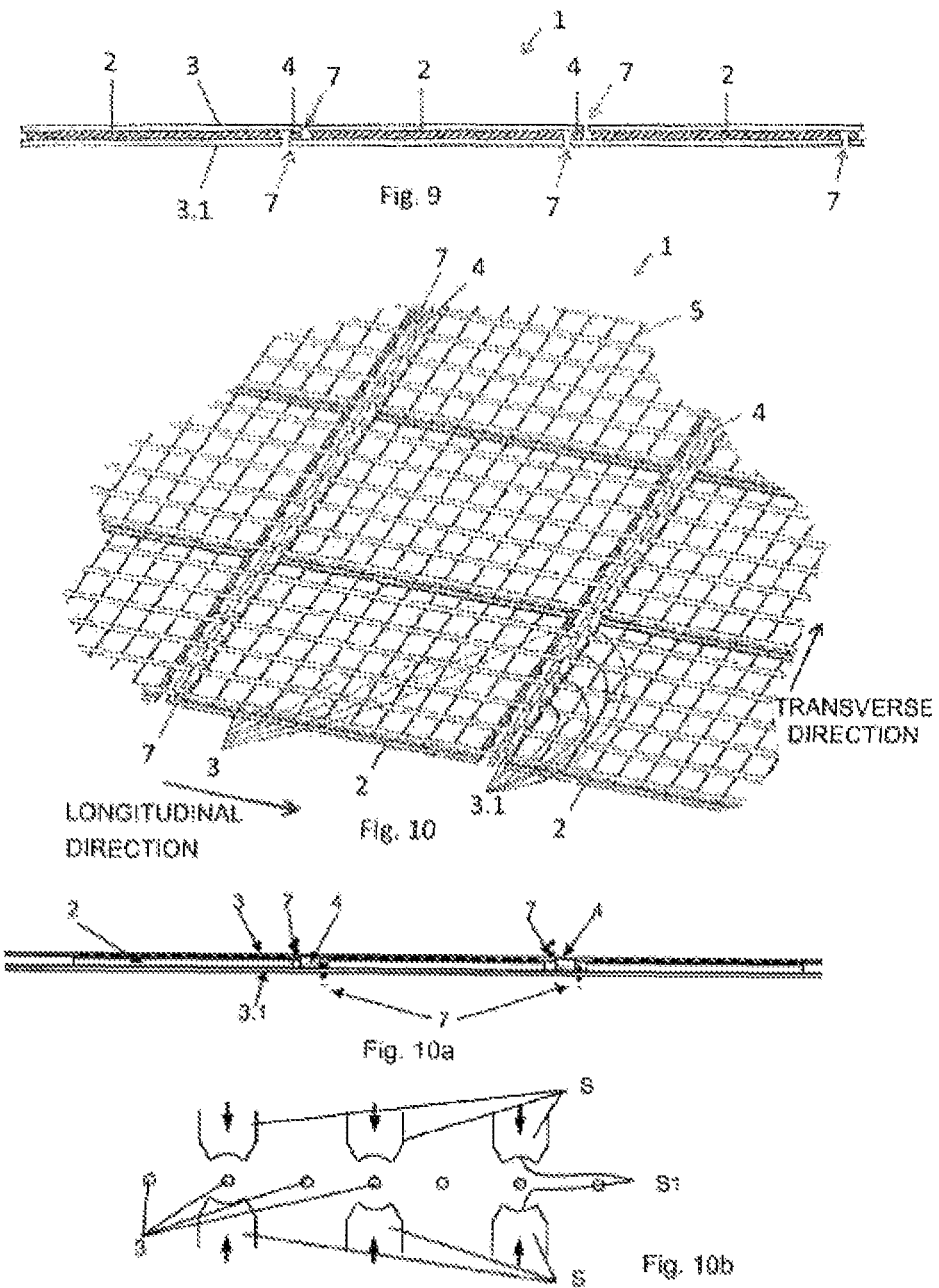

TRANSVERSE DIRECTION

LONGITUDINAL DIRECTION

TRANSVERSE DIRECTION

LONGITUDINAL DIRECTION

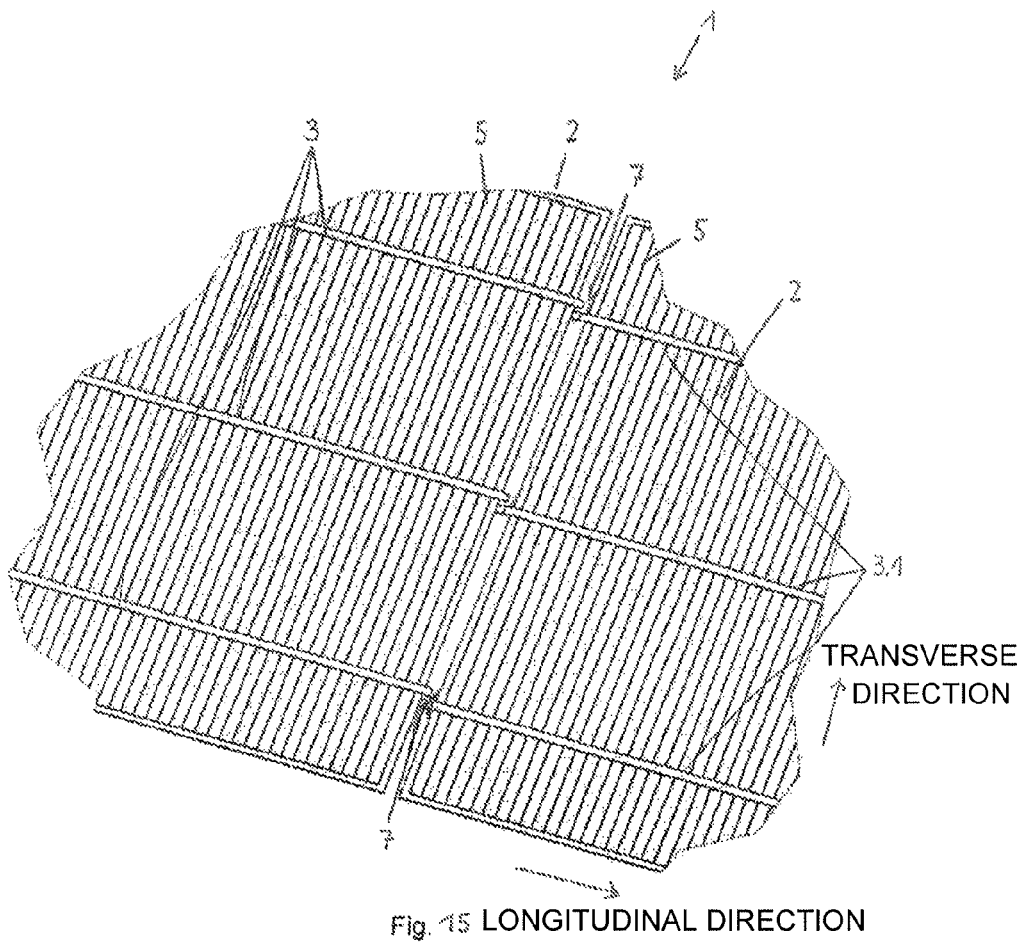
Fig. 15 LONGITUDINAL DIRECTION
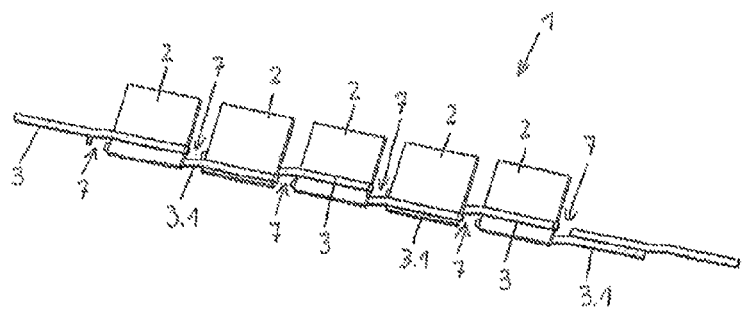
Fig. 16

INDIVIDUAL UNIT X

METHOD FOR CONTACTING AND CONNECTING SOLAR CELLS

BACKGROUND OF THE INVENTION

The invention relates to a method for contacting and connecting solar cells, wherein contacting the solar cells is carried out through wire conductors, and a plurality of solar cells are combined with each other through the wire conductors so as to form the solar cell combination.

A solar cell usually consists of a substrate having a front side and a back side, wherein a contact structure is applied onto at least one of the two sides. Typically, the contact structure has a width of at least 100 μm, whereas its thickness is only approximately 10 to 15 μm. A larger width causes a decrease of efficiency due to the resulting increased shading, whereas reducing the width results in the disadvantage that the line resistance of the contact structure is increased. Furthermore, the current of the individual contact structures is fed into busbars causing further shading on the front side surface.

On the back side of the solar cell there is usually a large-area contact structure that collects the current extensively.

Connecting solar cells is generally carried out through contact ribbons that are soldered onto the busbars of the solar cell. All the current is fed through the contact ribbons. In order to keep the resistance losses as low as possible, a certain total cross-sectional area of these ribbons is required. The result of this is that there is a loss on the front side caused by the shading.

In order to create an optimal solar module it is therefore necessary that the contact structure of the solar cell and the number and dimensions of the contact ribbons are optimized in combination with each other.

A problem here is the handling and positioning of the thin wires on the solar cell. In particular the series connection of the cells causes problems since—analogous to the solder ribbons of the standard soldering process—the wires have to be brought from the front side of the first solar cell to the back side of the second solar cell. This implies also that for contacting front and back sides, the same material has to be used.

From DE 298 05 805 U1, a device for processing solar cells is known, wherein individual solar cells are interconnected with electrical connectors so as to form a string. For this purpose, the device comprises a connection strip receptacle, a soldering paste dispenser that applies the soldering paste onto the connection strips, at least one solar cell depositing rack as a soldering station, one turning device for the connection strips and one transport device from the turning device to the solar cell depositing station for depositing the connection strips onto the solar cells.

The disadvantage of this solution is that only connectors in the form of strips can be used which, moreover, have to be turned over. A solar cell comprising at least one semiconductor layer arranged on a metallic carrier and a multiplicity of contact paths arranged on the semiconductor layer is described in DE 10 2006 041 046 A1. A lateral protrusion of at least one contact path is bent onto a back side of the carrier and is arranged electrically insulated with respect to the carrier. Solar cells arranged next to each other are preferably connected to each other through strip conductors having a perforated configuration so as to enable local contacts by soldering through. This construction of the solar cell, carrying out the method for producing the solar cell, and the constructional implementation of the strip conductor shall enable to interconnect individual solar cells so as to form solar modules and to interconnect the individual solar cells as desired. The carrier is formed here as a metal band, wherein the contact paths are arranged transverse to or along a longitudinal direction of the carrier, protrude laterally beyond the carrier band, and can be used in this manner for interconnecting. Furthermore, collecting paths are arranged transverse to the longitudinal direction and transverse to the contact paths and are electrically connected to the contact paths, and the contact paths as well as the collecting paths are glued in the region of the back side of the carrier. The contact paths or collecting paths are implemented in the form of copper wire or copper band. In order to avoid an electrical connection between the contact path and the metallic carrier, insulations implemented as edge insulations are arranged along the edge. Overall, structuring and connecting individual solar cells by using perforated strip conductors is problematic, and using edge insulations involves increased manufacturing-related expenses.

A wire system for electrically contacting a solar cell, comprising a wire conductor that runs alternately between a first contacting section and a second contacting section arranged spaced apart from the first contacting section in such a manner that the wire conductor forms the wire system with a mesh-like arrangement which extends with a multitude of meshes along an extension direction, is known from DE 10 2007 022 877 A1. The wire conductor is fixed in the mesh-like arrangement through fixing means provided in addition to the wire conductor, and/or through fixing means in the form of sections of the wire conductor, which section are wound around each other. The wire conductor runs as an endless string periodically alternating back and forth along an extension direction between a first contacting section and a second contacting section. The two contacting sections are regions of the wire system, which regions are equidistantly spaced apart from each other and run along the extension direction of the wire system. In each case two solar cells arranged next to each other have solar cell contacting sections which are arranged opposing each other in the adjoining edge regions of the solar cells and which are connected to each other through the mesh-like wire conductor. Furthermore, an electrically insulating base insulator layer is provided in the solar cell contacting section of a solar cell, and an electrically insulating emitter insulator layer is provided in the adjacent solar cell so that a series connection is generated. Producing the mesh-like wire conductor is relatively complicated. A significant disadvantage of this solution is also that the efficiency is negatively influenced because the areas for contacting between front side and back side are required in two dimensions.

The strings produced as a pre-stage for the assembly of modules have the disadvantage that the cells are put on individually and are covered with tin-plated copper band pieces which cover the cells and also extend below the next cell to be put on. These copper bands are soldered with different processes. This method requires preparation of the cells with a print image as solder connection material and as strip conductor for "collecting" the free electrons and transporting to the copper bands.

The strings are picked up by handling devices, aligned and assembled so as to form modules. The assembled strings are electrically connected through cross-connectors so as to form a module. The required connections are produced successively in individual process steps resulting in long production times.

From DE 102 39 845 C1, an electrode for contacting an electrically conductive surface, in particular at least one surface of a photovoltaic element, is known. Said surface consists of an electrically insulating, optically transparent film, an adhesive layer applied onto a surface of said film, and a first group of substantially parallel, electrically conductive wires which are embedded in the adhesive layer, protrude with a portion of their surface from the adhesive layer, and, at least on the surface protruding from the adhesive layer, are coated with a layer having a low melting point, wherein the wires of the first group are electrically connected to a first contact strip.

A second group with wires running substantially parallel to each other is arranged between the transparent film and the wires of the first group, wherein the wires of the first and second groups together form a grid, and wherein the wires of the second group are electrically connected to a second contact strip. Due to the use of the film and the adhesive, this constructional configuration is very complicated. In the case of an irregular thickness of the adhesive layer, the wires protrude irregularly from said adhesive layer or can also be completely covered by the adhesive, which can result in defects. Furthermore, the film and the adhesive remain in the module; this implies relatively high demands in terms of long-term stability to be met by the adhesive and the film and therefore causes relatively high costs. Moreover, the prefabrication of electrodes from wire, optically transparent film and adhesive is technologically sophisticated.

A method for interconnecting solar cells by using prefabricated metal mesh (e.g. aluminum gage) which is contacted with the surface of the cell on the front side and the back side is known from JP 59115576 A. Under the influence of pressure and temperature, the metal mesh is connected in each case to one cell by means of a heating unit. In the case of this solution, handling is relatively complicated.

In EP 0 440 869 A1, a component is described which comprises a photosensitive semiconductor plate having a barrier structure, electrically conductive current collector contacts arranged on both sides of the semiconductor plate, and protective coatings and current dissipating electrodes arranged on both sides of the semiconductor plate. At least the electrically conductive current collector contacts arranged on the front side of the semiconductor plate are implemented in the form of electrically connected and successive sections which are in contact or not in contact with the surface of the semiconductor plate. For this purpose, the current collector contacts are made from a bent wire. This embodiment is very complicated and it can easily occur that the thin bent wire gets crushed.

Furthermore, all known assembly technologies for solar modules have reached their limits with regard to their possible cycle time and the processing of thin cell materials, which is counteracted through stringing together a plurality of machines. In general, this has a negative effect on the production costs.

Moreover, the connection materials cover an undesirably large portion of the usable silicon surface and thus deteriorate the efficiency of the solar cell.

Furthermore, it is common to apply special metal pastes (mostly silver or silver alloys) in the form of strip conductors onto the solar cells (so-called bars), e.g., by using the screen printing method, in order to ensure contacting with the wire conductors. This makes the solar cells even more expensive.

SUMMARY OF THE INVENTION

It is an object of the invention to provide a method for contacting and connecting solar cells and solar cell combinations produced by means of said method, wherein costs are minimized and the efficiency of the solar cells is improved.

Another object of the invention is to reduce the printed regions for the bars or strip conductors or to eliminate them completely.

These and other objects are achieved with the features of the invention as described and claimed hereinafter.

The method for contacting and connecting solar cells is carried out according to the invention by means of at least two independent electrodes, wherein at least one electrode is formed from at least one or a plurality of wire conductors that are substantially parallel to each other, and after the contacting between solar cells and electrodes, establishing a series connection or parallel connection takes place by separating the wire conductors required for this at the required positions and by establishing the connection between the electrodes, wherein establishing the connection between the electrodes is implemented before or after separating.

It is therefore possible to connect or contact the electrodes with each other directly or through contact elements/cross-connectors before or after separating.

According to the method, contacting and connecting solar cells by means of wire conductors so as to form a solar cell combination is carried out, for example, in that in a manner as continuous as possible, a plurality of solar cells are connected to at least one first wire conductor that runs preferably continuously and linearly in the longitudinal direction of successively arranged solar cells, or are connected to a group of preferably continuously running first wire conductors and to at least one preferably continuously running further contact element or a group of preferably continuously running further contact elements so as to form together a solar cell combination, and an electrical connection is established between the first wire conductors, the further contact elements and the solar cells of the solar cell combination, and if required, the first wire conductors and/or the second contact elements can be separated before or after establishing the electrical connection in such a manner that a series connection or parallel connection of the solar cells is created or can be established.

By using in particular continuous first wire conductors and further (in particular continuous) contact elements which extend linearly in the assembly direction, and/or transverse to the assembly direction, extend also linearly and are optionally separated, the production of solar cell combinations is revolutionized and thus is made significantly more effective and more cost-efficient.

Preferably, the first wire conductors are contacted on the upper side of the solar cells, wherein then the further contact elements can be configured in the form of two electrical cross-connectors which run transverse to the first wire conductors, between adjacent solar cells, and are applied to the first wire conductors and are connected to them. Subsequently, the first wire conductors are separated transverse to their longitudinal extension and parallel to the electrical cross-connectors between adjacent solar cells so that a stripe-like combination of solar cells with a protruding region of first contact elements and with the two cross-connectors is generated. This region is connected to the lower side of the adjacent solar cells so that at least one cross-connector is provided on the lower side of the adjacent solar cells and is now contacted with them.

As an alternative, it is also possible to fasten and contact preferably a multiplicity of first wire conductors on the upper side of solar cells arranged next to each other and to fasten and contact the cross-connectors on the lower side of the solar cells, wherein the cross-connectors and the first wire conductors likewise run perpendicular to each other. Subsequently, the first wire conductors are separated, transverse to their longitudinal extension and parallel to the cross-connectors, between adjacent solar cell(s) so that a stripe of solar cells is generated, which solar cells are connected to each other through the two cross-connectors, and which stripe has a protruding region with first wire conductors. Subsequently, the region of the first wire conductors protruding beyond the solar cell(s) is contacted with the cross-connectors on the lower side of adjacent solar cells.

Another method variant for producing the solar cell combination is that the first linearly running wire conductors are also contacted on the upper side of, in particular, a plurality of solar cells and that further contact elements are configured in the form of second wire conductors and also in the form of cross-connectors, wherein the second wire conductors run in particular linearly and are contacted on the lower side of the solar cells substantially parallel to the first wire conductors. The first and the second wire conductors are connected to each other through the electrical cross-connectors, wherein the cross-connectors preferably run between the first and second wire conductors.

Subsequently, the connections of the first wire conductor and the second wire conductor to the cross-connector are in each case alternately disconnected so that a series connection is created.

In a third production variant, the preferably continuous first wire conductor(s) runs (run) alternately between the upper side and the lower side of adjacent solar cells. The second contact elements are preferably configured in the form of continuously running second wire conductors which run substantially parallel to the first wire conductors, wherein the second wire conductors run alternately (opposite) to the first wire conductor(s) between the lower side and the upper side of adjacent solar cells. Subsequently, the first wire conductors and the second wire conductors are preferably alternately disconnected between the solar cells in such a manner that likewise a series connection is created.

Disconnecting the first and/or the second wire conductor is carried out mechanically or preferably by means of laser.

In particular, successively arranged solar cells are connected to each other by a multiplicity of first wire conductors and/or second wire conductors and/or cross-connectors, which are arranged next to each other with regard to the longitudinal direction so that from the first wire conductors and/or the second wire conductors and/or cross-connectors in connection with the solar cells a kind of fabric is generated.

Preferably, the ends of the first and/or second wire conductors and/or cross-connectors are provided with electrical collecting connectors for current collection. After the first and second wire conductors or the cross-connectors have been applied to the solar cells, establishing the contacting (electrical connection) is carried out by means of conventional bonding technologies, e.g., by gluing, soldering or welding.

In this connection it is possible for the first time that establishing the contacting between the wire conductors or the cross-connectors and the solar cells is carried out while reducing or eliminating the printing of bars onto the solar cell. Since the bars consist in most cases of silver, this means a considerable cost reduction for the solar cell combinations.

The solar cell combination is preferably produced such that said solar cell combination is separated into a plurality of strings or solar cell modules, or that it forms a solar cell module. Thus, it is actually possible for the first time to produce a large combined surface consisting of solar cells that are connected and contacted with each other.

The solar cell combination comprises a plurality of solar cells that are connected and contacted with each other, wherein the solar cells are connected and contacted with at least one first wire conductor that runs (continuously) in the longitudinal direction of successively arranged solar cells, or are connected and contacted with a group of first wire conductors, and are connected and contacted with at least one further contact element or a group of further contact elements so as to form together a solar cell combination, and wherein before or after establishing the electrical connection, the first wire conductors and/or the further contact elements are separated (between the solar cells) such that preferably a series connection is present.

In a first variant, a plurality of solar cell combinations formed through separating can be connected and contacted again with each other. For this, the first wire conductor(s) can in each case run from the upper side of a solar cell to the lower side of the adjacent solar cell. The further contact elements are then configured in the form of cross-connectors which are arranged between the lower side of the solar cell and the first wire conductor and which are contacted with the solar cell(s) and the first wire conductor(s).

In a second variant, a multiplicity of first wire conductors that are parallel to each other are in each case also contacted on the upper side of the solar cells. The further contact elements are configured in the form of second wire conductors and in the form of cross-connectors, wherein the second wire conductors are contacted on the lower side of the solar cells substantially parallel to the first wire conductors, and wherein transverse to the first and the second wire conductors, at least one cross-connector extends which is preferably contacted in series connection with said first and second wire conductors.

For ensuring the series connection, the first and second wire connectors are alternately disconnected from the cross-connector. Furthermore, in this variant, the cross-connector is preferably arranged between the first and second wire conductors and thus is preferably arranged between two adjacent solar cells and perpendicular to the first and second wire conductors.

This new contacting and connecting of solar cells by means of two independent electrodes in the form of first and second wire conductors, wherein at least one electrode consists of thin wires that are parallel as far as possible, enables the production of a new generation of solar cell modules.

A particular feature here is that different electrode materials and joining technologies can be used for front and back sides.

A wire field preferably consists in each case of 10-50 (optimal are approx. 20) wires in almost equidistant arrangement and with a thickness of 50-300 µm. The cross-section of the wires of the first wire conductors (first electrode) and the cross-section of the wires of the second wire conductor (second electrode) can be different, e.g., round, oval, rectangular, trapezoidal, etc. The wire conductors are made of metal, for example, Cu, Al, Ni, steel, and can be coated, in particular for establishing the connection to the solar cells or to each other, for example, with solder (Sn—Pb, Sn—Pb—Ag, Sn—Bi, etc.), with Ni, or also with an electrically conductive adhesive layer.

After generating an electrical contact between the first electrode and the front side of the solar cell and also between the second electrode and the back side of the solar cell, the connection of the two electrodes is implemented. For generating the electrical contact, known soldering, gluing or bonding techniques can be used. A particular feature is that, for the first time, different joining technologies can be used for the front and back sides. For connecting the first electrode (first wire conductors) and the second electrode (second wire conductors or bands), preferably, the contact elements in the form of cross-connectors running in the direction transverse to the wires are used. The cross-connectors are electrically conductive and, for example, can be made of metal or a metal compound. The connection between electrodes (first and second wire conductors) and the contact element/cross-connector can be implemented through a solder-, crimp-, welded or glued connection.

The contact element/the cross-connector is preferably arranged between the first and second (both electrodes) wire conductors (in this case between adjacent solar cells) or above or below both of them.

The contact elements/cross-connectors can be structured so that later in the module, the light reflected by them is directed through total internal reflection to the active cell surface.

Furthermore, coating the contact elements is conceivable such that no reflective and shiny surface is generated, but a diffusely reflecting surface is generated so that likewise a large portion of the reflected light reaches the active cell surface with the result that the efficiency can be further increased.

For producing such a solar cell combination, the first wire conductors are arranged above the upper side of the solar cells and the second wire conductors are arranged below the lower side of the solar cells.

For this purpose, the second wire conductors are first positioned on a support and subsequently, the solar cells and the cross-connectors are placed thereon and thereafter, the first wire conductors are deposited on the upper side of the solar cells. This still "loose combination" is subsequently connected to each other and contacted. In order to bring the up to now still short-circuited cells into an electrically useful series connection or parallel connection, it is now necessary to remove the superfluous and disturbing wire bridges.

For this purpose, alternately, every second wire field in the spaces between the cells is separated or cut out so as to disconnect all connections with identical polarity within the string.

Separating/cutting can be carried out, among other things, by means of laser or, in particular, a self-centering cutting device which exerts no forces during cutting on the wires so as to avoid damage to the solar cells.

Here, it is possible to adjust the cutting device by means of a camera system using the cell edges as a reference.

In a third variant of the solution according to the invention, the first continuous wire conductor(s) runs (run) alternately between the upper side and the lower side of adjacent solar cells. The further contact element(s) is (are) configured in the form of one or a plurality of second wire conductors which are substantially parallel to the first wire conductors, wherein the second wire conductor(s) runs (run) alternately opposite to the first wire conductor(s) between the lower side and the upper side of adjacent solar cells. Furthermore, the first and the second wire conductors are preferably separated between the solar cells in such a manner that a series connection is present. Preferably, a multiplicity of first wire conductors and a multiplicity of further contact elements are provided so that a kind of fabric is formed. In this manner, in particular, a multiplicity of first wire conductors are fed in each case over one solar cell, and by using second wire conductors, a multiplicity of these second wire conductors is also fed in each case over one solar cell, thereby ensuring an optimal electron collection.

In the top view on the solar cell combination, the first and second wire conductors are arranged alternately.

The first wire conductors and/or the second wire conductors and/or the cross-connectors are preferably configured in the form of a wire having a substantially round or rectangular cross-section, or are configured in the form of a band and have in particular only a very small cross-section. Said very small cross-section is possible here if with one solar cell a plurality of first and/or second wire conductors are contacted.

Furthermore, the ends of the first and/or second wire conductors and/or the ends of the cross-connectors are provided with electrical collecting connectors for tapping the current.

The first and/or the second wire conductors and/or the cross-connectors are connected to the solar cells in particular in a firmly bonded manner, e.g., by gluing, soldering or welding.

For the first time, it is also possible to connect the first and/or second wire conductors and/or the cross-connectors directly to the solar cells without the need of printing bars (strip conductors) thereon.

Furthermore, it is possible to divide the solar cell combination into segments by separating the wire conductors or cross-connectors. These segments can be placed offset on top of each other and can be connected so as to form a solar cell module or a module combination.

However, the production can also be carried out in strings, as previously done.

A significant advantage of the solution according to the invention is the ability to standardize interconnections and matrix layout by parallelizing and using suitably wider electrode fields so that unnecessary cell and string handlings can be avoided.

With the solution according to the invention, production costs and thus the costs for the solar cell modules can be significantly reduced. Furthermore, it is possible to substantially reduce the expenses for equipment or the facility costs, and to reduce the floor space required for the production of solar cells. Since it is possible to form a solar cell combination from a multiplicity of solar cells in a largely continuous manner or in one work step (in variant 2), the load acting on the cells due to assembly stress decreases.

Another advantage of the solution according to the invention is due to the fact that the use of expensive materials required for printing the strip conductors can be significantly reduced, or it is possible to completely eliminate the printing of strip conductors since the wire conductors can be connected directly, in particular soldered or glued, to the solar cells.

Furthermore, with the invention, the efficiency of the solar cell modules can be considerably improved compared to conventional solutions. This is in particular possible, when using a multiplicity of wire conductors for each solar cell, through the reduction of shaded surfaces and the increased reflection of the lateral regions of the wires and also through lower internal losses in the solar cell due to an almost full-surface electron collection. Furthermore, it is possible to reduce efficiency losses caused by cell breakage.

BRIEF DESCRIPTION OF THE DRAWINGS

The invention is explained in more detail hereinafter with reference to illustrative embodiments depicted in the accompanying drawings, in which:

FIGS. 1 to 6 show the method steps for producing a first variant of a solar cell combination from solar cells by using first wire conductors and further contact elements in the form of cross-connectors running transverse to said first wire conductors, wherein FIG. 1 shows a longitudinal section of solar cells arranged one behind the other and next to each other, onto the upper side of which first wire conductors have been placed, wherein between two successively arranged solar cells, two cross-connectors are placed over the first wire conductor, FIG. 2 shows a three-dimensional view from above of a partial area according to FIG. 1, FIG. 3 shows a first row R1 of solar cells arranged next to each other, which row has been formed by separating the first wire conductors from the solar cells arranged upstream thereof, FIG. 4 shows two rows R1, R2 of solar cells which are to be connected to each other, FIG. 5 shows a side view of rows R1 to R3 of solar cells, which rows are contacted with each other, FIG. 6 shows a three-dimensional view of a solar cell combination produced according to variant 1, FIGS. 7 to 10 show the method steps for producing a second variant of a solar cell combination from solar cells by using first wire conductors and further contact elements in the form of cross-connectors running transverse to said first wire conductors, and also second wire conductors which are parallel to the first wire conductors and which run on the lower side of the solar cells, wherein FIG. 7 shows a longitudinal section of solar cells arranged one behind the other and next to each other, wherein first wire conductors run in the longitudinal direction over the upper sides of the successively arranged solar cells, and the second wire conductors rest against the lower side of the solar cells, and the cross-connectors run in each case between the first wire connectors and the second wire connectors, FIG. 8 shows a three-dimensional view from above according to FIG. 7, FIG. 9 shows a solar cell combination according to FIGS. 7 and 8 in a longitudinal section, wherein subsequently the connection between the first and second wire conductors to the cross-connector has been alternately disconnected, FIG. 10 shows the solar cell combination according to FIG. 9 in a three-dimensional view from above, FIG. 10a shows a further variant, similar to FIG. 9, but with different first and second wire conductors, FIG. 10b shows a schematic illustration of the cutting device, FIG. 10i shows an illustration of a solar cell combination with first (upper) wire conductors 3 in the form of thin wires and second (lower) wire conductors 3.1 in the form of a full-surface film.

FIGS. 11 to 18 show the method steps for producing a third variant of a solar cell combination from solar cells by using first wire conductors which run alternately between the upper side and the lower side of the solar cells, and further contact elements in the form of second wire conductors which are parallel to the first wire conductors and which run alternately opposite to the first wire conductors between the lower sides and the upper sides of the solar cells, wherein FIG. 11 shows a longitudinal section of solar cells arranged one behind the other and next to each other, wherein the first wire conductor runs over the upper side and the lower side of the adjacent solar cells, and the second wire conductor runs oppositely thereto between the lower side and the upper side of the adjacent solar cells, FIG. 12 shows a three-dimensional view according to FIG. 11 from above, FIG. 13 shows an enlarged three-dimensional view according to FIG. 11 from above, wherein, however, no printed strip conductors were used, FIG. 14 shows a longitudinal section of solar cells arranged one behind the other and next to each other according to FIG. 11, wherein the first and the second wire conductors were alternately separated between successively arranged solar cells so that a series connection has been generated, FIG. 15 shows a three-dimensional view according to FIG. 14 from above, FIG. 16 shows a three-dimensional view of a string according to variant 3 with only one first and one second wire conductor, FIG. 17 shows the illustration of a weaving device for producing a solar cell combination according to variant 3, FIG. 18 shows detail X according to FIG. 17.

DETAILED DESCRIPTION OF THE PREFERRED EMBODIMENTS

FIGS. 1 to 6 illustrate the method steps for producing the first variant of a solar cell combination 1 from solar cells 2 by using first wire conductors 3 and further contact elements in the form of cross-connectors 4 running transverse to said first wire conductors.

Figure 1:
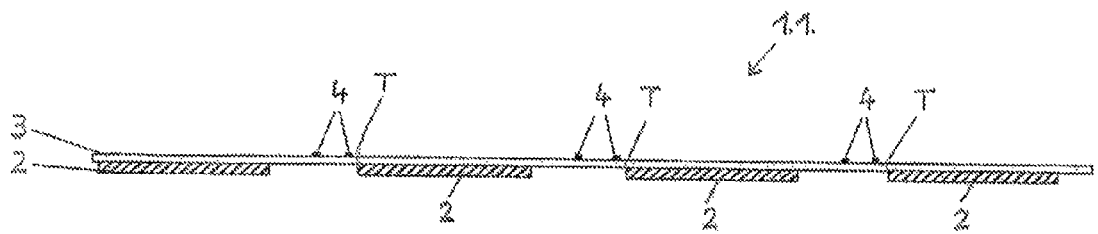
Figure 2:
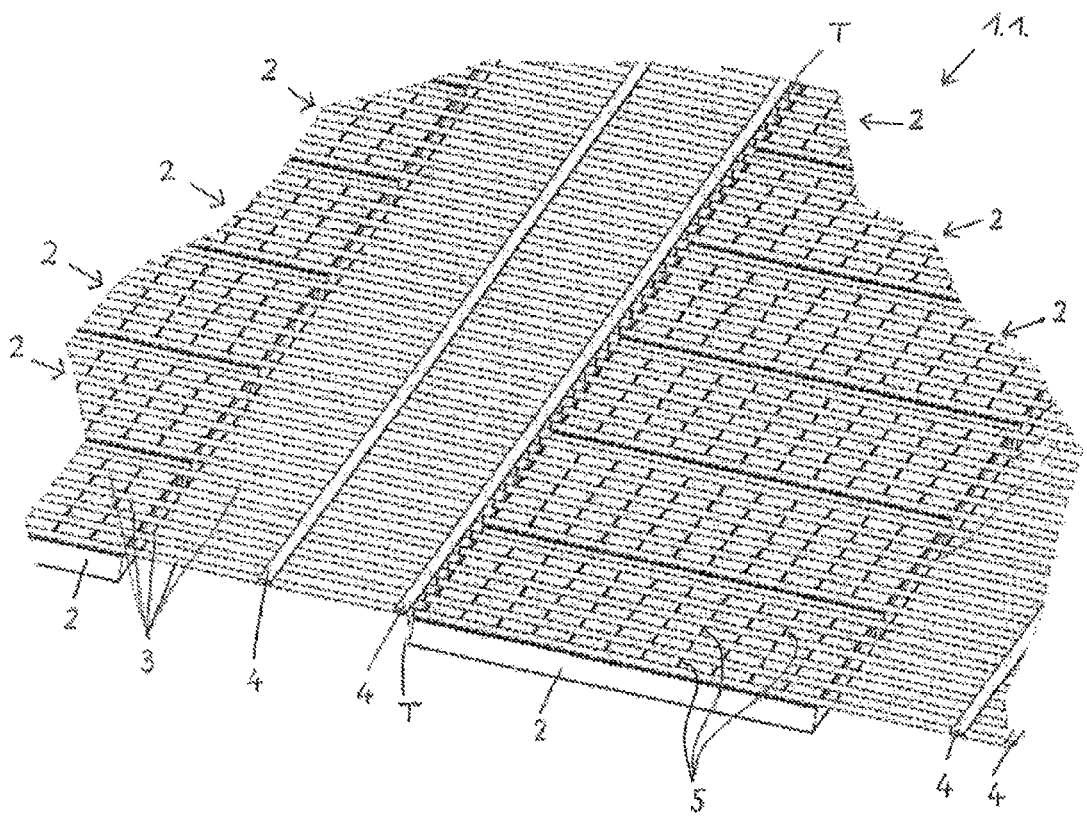

FIGS. 1 and 2 illustrate a first production step wherein a multiplicity of solar cells 2 were placed next to each other and one behind the other onto a non-illustrated support. A multiplicity of first continuous wire conductors 3 were positioned over the solar cells 2 in the longitudinal direction, and cross-conductors 4 were placed transverse to and above the first wire conductors 3 and in each case between a row of successively arranged solar cells 2 and also spaced apart from the successively arranged solar cells.

In the FIGS. 1 and 2, a separating line T is indicated in each case directly before a solar cell 2. FIG. 2 shows that on the surface of the solar cells 2, strip conductors 5 are printed transverse to the first wire conductors 3. The solar cells 2 positioned relative to each other, the first wire conductors 3 and the cross-connectors 4 are now connected to each other and thus contacted, and thus an intermediate combination 1.1 is produced. This is preferably carried out through soldering. Subsequently, the first wire conductors 3 are separated along the separating line T so that a plurality of rows R1, R2 ... of solar cells 2 arranged next to each other are generated which comprise a protruding region B of first wire conductors 3 and two cross-conductors 4 contacted therewith (a first row R1 is shown in FIG. 3).

FIG. 4 shows two rows R1, R2 of solar cells 2 which are to be connected to each other. The rows R1, R2 are positioned in such a manner that the two cross-conductors 4 of the region B of the first row R1 are positioned below the lower side of the solar cells 2 of the following row R2. For this purpose, the first row R1 rests on an assembly support 6. Now, the second row R2 is placed in the direction of the arrow onto the assembly support 6 and thus onto the region B of the first row R1 and thereby onto the cross-conductors 4 of the first row R1. As a result, the region B of the first row is bent toward the assembly support 6 as shown in FIG. 5, in which in this manner three rows R1 to R3 are positioned relative to each other. The rows which are positioned relative to each are now connected to each other, e.g., through soldering, so that the cross-conductors 4 are contacted on the lower side of the adjacent row of the solar cells 2.

Figure 6:
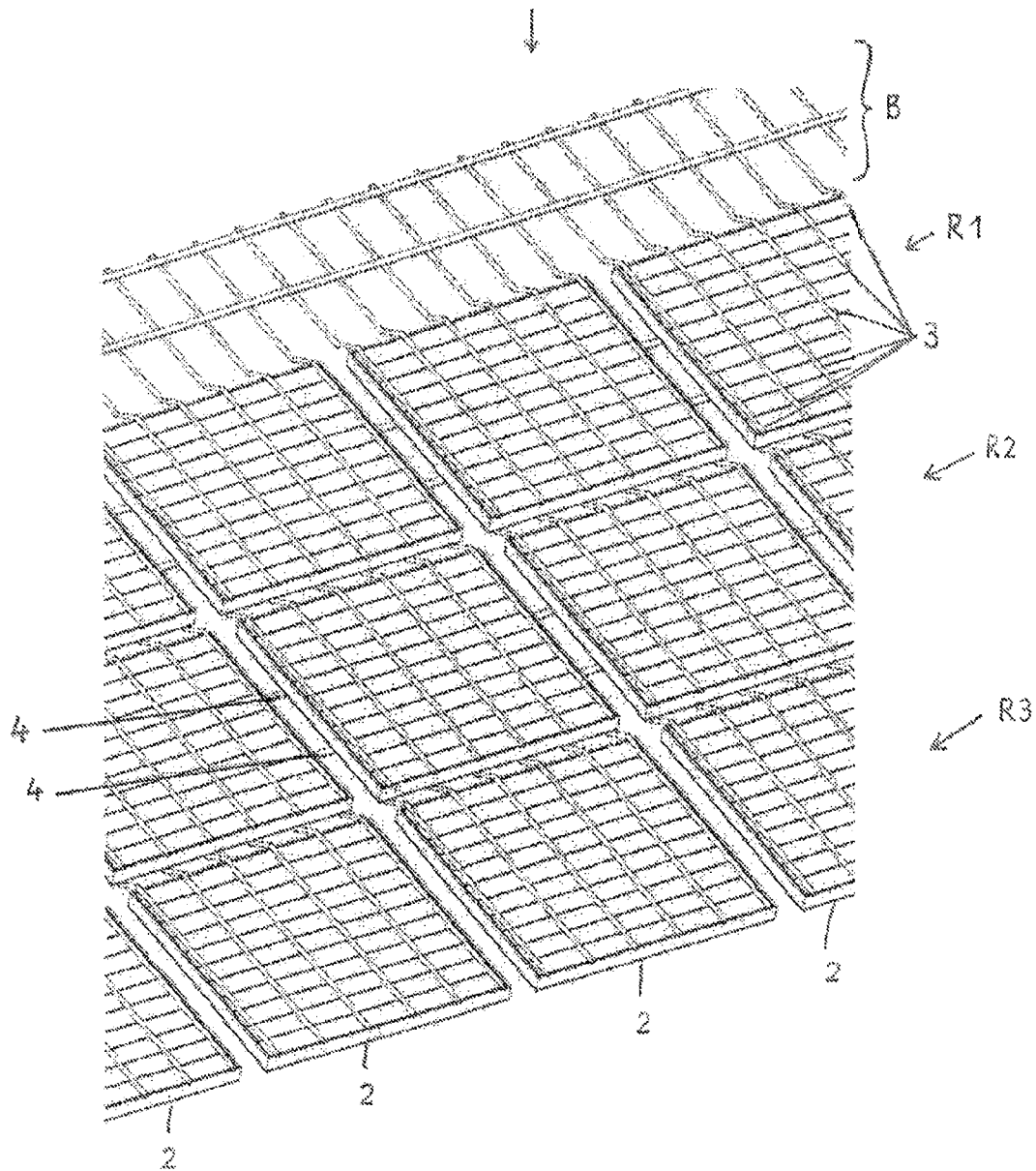

A solar cell combination 1 produced with this first method is illustrated in a three-dimensional view in FIG. 6. Three rows R1 to R3 of solar cells 2 were connected to each other. Here, over each solar cell 2, six first wire conductors 3 are fed to the lower side of the solar cell 2 adjoining in the longitudinal direction. In each case two cross-conductors 4 extend over the solar cell rows R1, R2 and are arranged between the lower sides of the solar cells 2 and the first wire conductors 2 which extend to the lower side of the solar cells (see FIG. 5).

According to a non-illustrated method variant, this combination can also be produced in that in the first method step, the cross-conductors are not contacted over the first wire conductors but are contacted directly on the lower side of a row of solar cells. In this case too, the first wire conductors 3 are separated such that a plurality of rows are generated and the protruding regions B of the rows are positioned below the lower sides of adjacent solar cells of the adjoining row and are contacted with these solar cells.

The method steps of a second variant for producing a solar cell combination are shown in the FIGS. 7 to 10. Likewise, longitudinally extending first wire conductors 3 are used. The further contact elements are configured in the form of cross-conductors 4 running transverse to the first wire conductors and to second wire conductors 3.1 which are parallel to the first wire conductors 3 and which run on the lower side of the solar cells 2.

Figure 7:
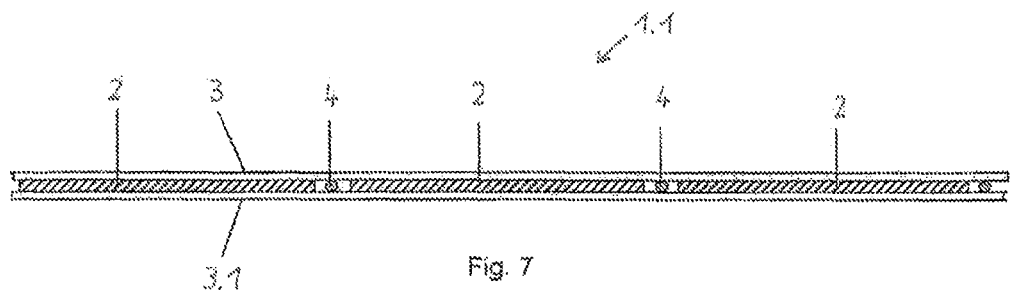

FIG. 7 illustrates the longitudinal section of solar cells 2 arranged one behind the other and next to each other, wherein first continuous wire conductors 3 run in the longitudinal direction over the upper sides of the successively arranged solar cells 2, and second continuous wire conductors 3.1 rest against the lower side of the solar cells 2, and the cross-conductors 4 run in each case between and transverse to the first wire conductors 3 and the second wire conductors 3.1, and run in each case between the successively arranged solar cells 2.

Figure 8:
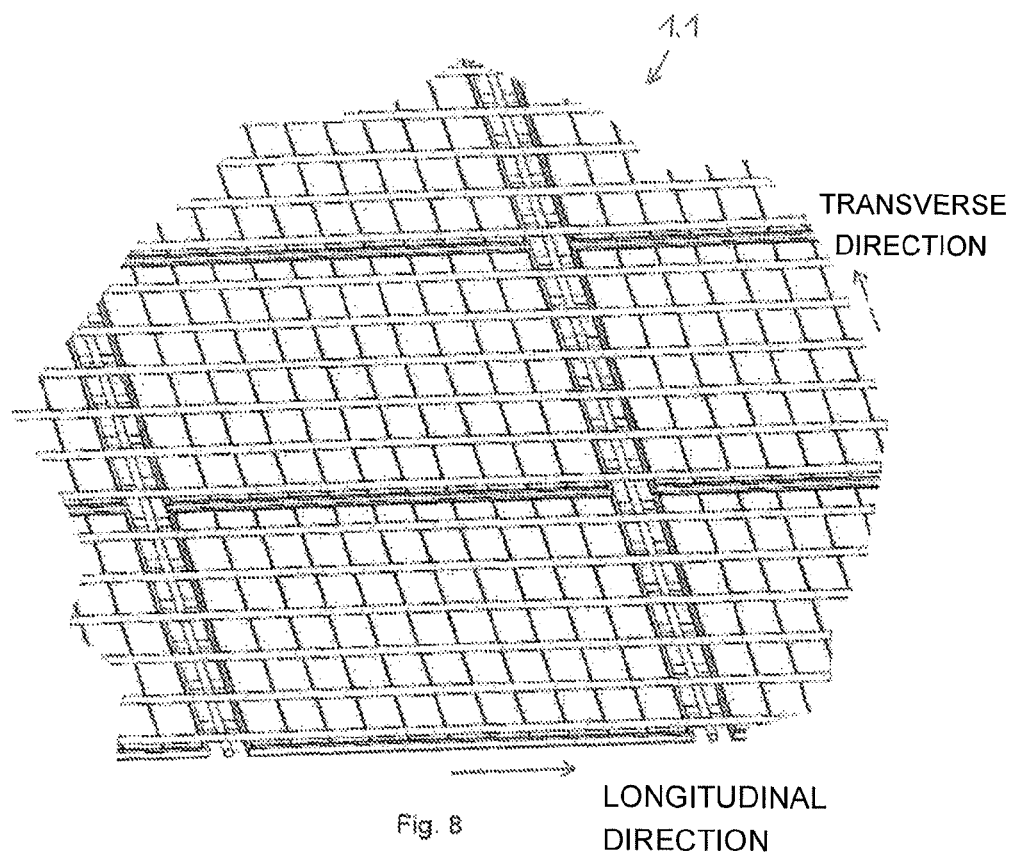

FIG. 8 shows the three-dimensional view from above according to FIG. 7. It is shown here that the solar cells 2 successively arranged in the longitudinal direction are provided on their upper side in each case with a plurality of continuous first wire conductors 3 and are provided on their lower side with a plurality of second wire conductors 3 which are parallel to said first wire conductors and offset thereto in the transverse direction. It is shown that the cross-conductors 4 extend perpendicular to the first and second wire conductors 3, 3.1 in the transverse direction between them and between the solar cells 2. Preferably, first the second wire conductors 3.1, then the solar cells 2 and the cross-conductors 4, and subsequently the first wire conductors 3 are positioned and subsequently soldered, e.g., in a continuous process, so as to form an intermediate combination 1.1 (see FIGS. 7 and 8).

This intermediate combination 1.1 is not yet functional; the desired interconnection has still to be generated by separating the first and seconds wire conductors.

For implementing a series connection in the intermediate combination 1.1, the first and second wire conductors 3, 3.1 are alternately disconnected from the cross-conductor 4. A longitudinal section after separating the connection is shown in FIG. 9 in a longitudinal section and in FIG. 10 in a three-dimensional view from above. Only then, the functional solar cell combination connected in series according to FIGS. 9 and 10 is obtained. Shown therein are the gaps 7 generated in the first and second wire conductors 3, 3.1 through the separation, through which gaps the connection to the cross-conductors is alternately disconnected so that a suitable interconnection between the solar cells 2 and the first and second wire conductors 3, 3.1 has been generated.

A longitudinal section of a further variant is shown in FIG. 10a. Here, the first wire conductors 3 (first electrode) and the second wire conductors 3.1 (second electrode) are made from different materials and are likewise applied as continuous wires first to both sides of the solar cells, wherein the cross-connectors 4 were positioned between the first and second wire conductors 3, 3.1 and between two adjacent solar cells 2, and after generating an electrical contact between the first electrode (wire conductor 3.1) and the back side (here lower side) of the solar cell 2 and also between the second electrode (wire conductor 3.1) and the front side (here upper side) of the solar cell 2, the connection of the two electrodes (wire conductors 3.1, 3.2) was implemented, and then, as illustrated here, the superfluous and disturbing wire bridges were removed so that alternately between every second wire conductor 3, 3.1 to the cross connector 4, a kind of a gap 7 has been formed so as to bring the (previously still short-circuited) cells into an electrically useful connection (parallel or series connection).

Cutting out has been carried out, e.g., by means of a laser or, as illustrated, a self-centering cutting device which exerts during cutting no forces onto the wires, as schematically illustrated in FIG. 10b.

The cutting device consists, e.g., of blades S that can be moved in pairs relative toward each other, wherein here a plurality of blades S are provided which, corresponding to the shape of the illustrated first wire conductors 3 to be cut, which have a circular cross-section, are curved at their cutting edges S1. In this case, the cutting edges S1 have a concave curvature. The first wire conductors 3 illustrated in grey were cut by the blades S.

In the case of wire conductors having an angular (e.g., rectangular) cross-section, the cutting edges are preferably implemented substantially linearly (not illustrated).

It is possible to adjust the cutting device by means of a likewise non-illustrated camera system using the cell edges of the solar cells as a reference.

Figure 10C:
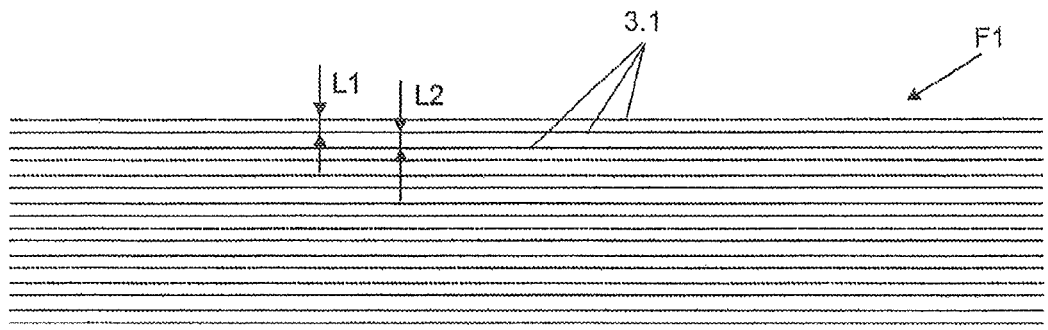
FIG. 10c shows an illustration of a (lower) first wire field F1 from second wire conductors 3.1.

In the illustrative embodiment according to FIG. 10c, two fields F1, F2 of substantially parallel first and second wire conductors 3, 3.1 are used.

Figure 10D:
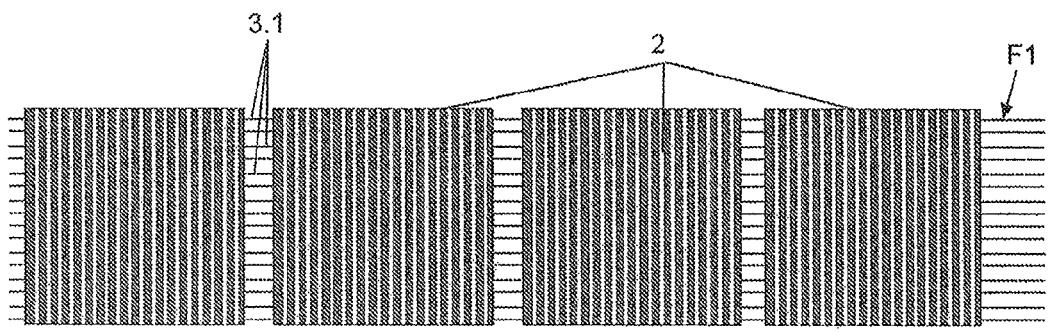
FIG. 10d shows an illustration of solar cells 2 positioned on the first wire field F1.
Figure 10E:
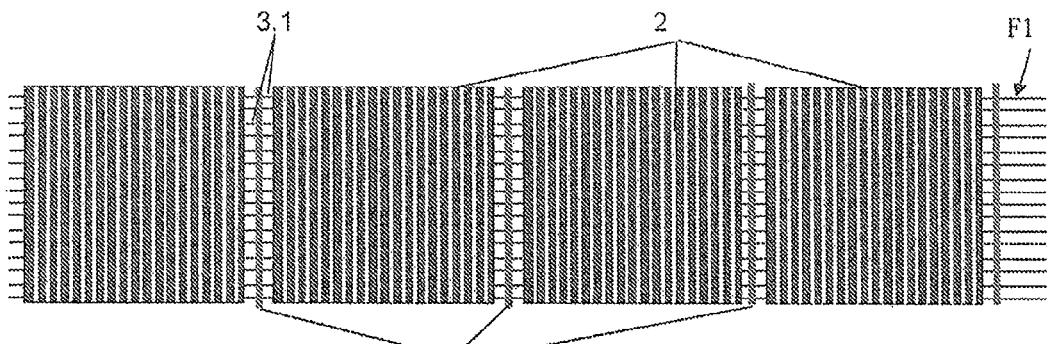
FIG. 10e shows an illustration according to FIG. 10d with cross-connectors 4.

The first wire field F1 illustrated here with lower second wire conductors 3.1 is laid over the entire length of the string or matrix to be produced and is spanned in the longitudinal direction of the wire conductors. After in each case two first wire conductors 3.1 which are arranged at a smaller spacing from each other, a larger spacing from the next two second wire conductors 3.1 is provided here. Subsequently, the solar cells 2 are positioned with their back sides above said first wire field F1 (FIG. 10d). If necessary, the contact between the back side of the solar cells 2 and the first wire field F1 can already be generated.

In the spaces between the cells of the solar cells 2, a contact element in the form a cross-connector 4 can be placed (FIG. 10e) so as to implement later the contact between first and second wire fields F1, F2. The contact elements/cross-connectors 4 have a thickness corresponding to the thickness of the solar cells 2; in this manner, no pressure is exerted onto the cell edge of the solar cell 2.

Figure 10F:
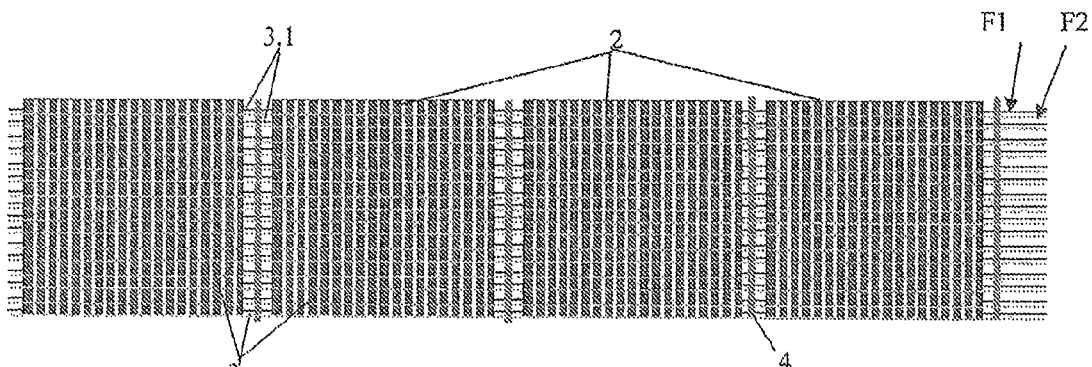
FIG. 10f shows an illustration according to FIG. 10e with a second wire field F2 from first wire conductors 3.

In the next step, the second wire field F2, which is formed from first wire conductors 3 running parallel to each other, is arranged and spanned, parallel to the first wire field F1, over the upper sides of the solar cells 2 and over the contact elements/cross-connectors 4, wherein the second wire field F2, as illustrated in FIG. 10f, is arranged offset to the first wire field F1. The first wire conductors 3 of the second upper wire field F2 are illustrated brighter here than the second wire conductors 3.1 of the first wire field F1 located at the bottom here. (The first and second wire conductors 3, 3.1 can also lie one above the other in a substantially aligned manner—not illustrated here.) The electrical connection between the wire fields F1, F2 and thus between first wire conductors 2 and second wire conductors 3.1 and the solar cell 2, and also between the first wire field F1 (second wire conductors 3.1) and the second wire field F2 (first wire conductors 3) and contact element/cross connector 4 is established. For this, different technologies can be used.

Figure 10G:
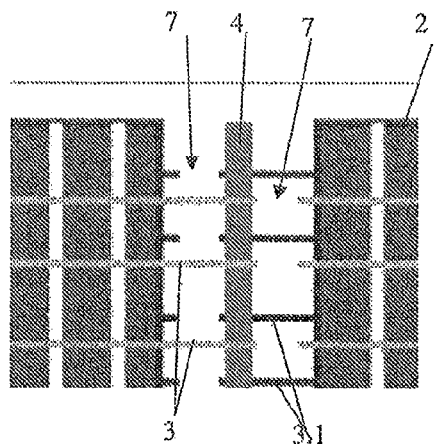
FIG. 10g shows an illustration of the separated first and second wire conductors 3, 3.2.
Figure 10H:
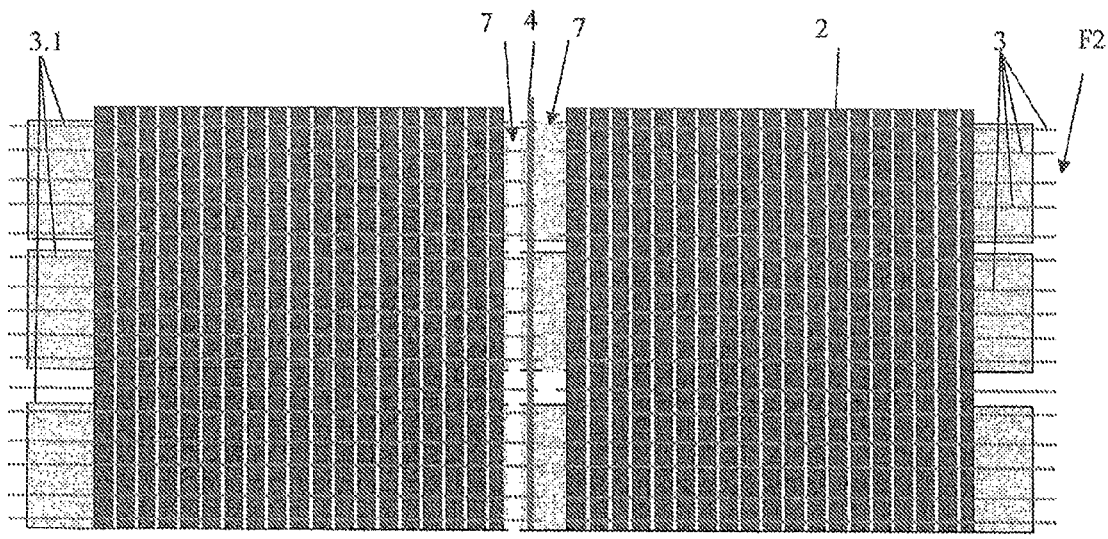
FIG. 10h shows an illustration of a solar cell combination with first (upper) wire conductors 3 in the form of thin wires and second (lower) wire conductors 3.1 in the form of wide bands.
Figure 10J:
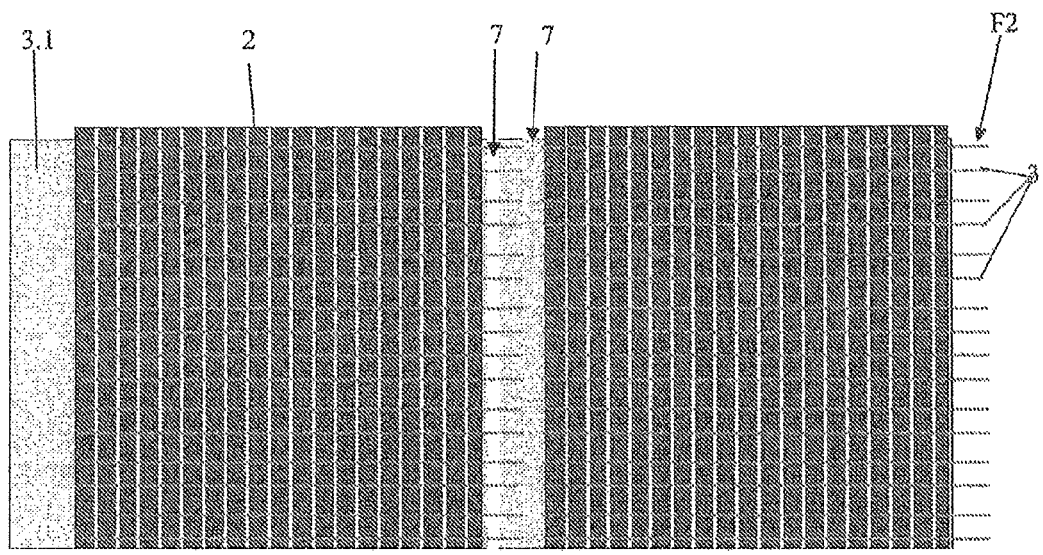

Finally, still superfluous connections are separated according to FIG. 10g so that gaps 7 are created between the second wire conductors 3.1, which are arranged here below the solar cells 2, and the cross-connectors 4, which gaps are in the illustration on the left side of the cross-connector 4, and wherein gaps 7 are also formed between the upper first wire conductors 3 and the cross connector 4, which gaps are arranged here on the right side of the cross connector 4, so as to establish a suitable interconnection.

The separating cut can be carried out mechanically or by means of laser, as described above.

In addition to the aforementioned illustrative embodiments, it is also possible to use wider electrode structures on the back side of the solar cells 2. This reduces the contact resistances for the current flow from cell to cell. Using wide electrode structures on the front side would result in increased shading.

According to the invention, thus, a second wire field F2 from first thin wire conductors 3.1, analogous to the illustrative embodiment according to FIGS. 10c to 10g, is used on the front side of the solar cells 2. In this manner, an optimized low power loss caused by shading and resistance is implemented. On the back side of the solar cells 2, second wire conductors 3.1 in the form of wider contact ribbons up to the size of bands are used. In this manner, the power losses in the contact structure on the back side can be reduced to a negligible level. Here too, after contacting the components, areas are punched out or otherwise cut out between the first wire conductors 3 (thin wires) and the cross connectors 4 so that gaps 7 are created, and areas are also removed between the second wire conductors 3.1 (metal bands) and the cross-connectors 4 so that likewise gaps 7 are created, thereby establishing the desired interconnection. By using contact bands, the production-related expenditures for separating are reduced.

According to a further illustrative embodiment, which is illustrated in FIG. 10i, it is also possible to form the back side contact of the solar cells 2 from a metal film that replaces a plurality of second wire conductors 3.1, which metal film has been designated here also with 3.1 and which, e.g., is soldered, glued or fastened with laser welding spots over the full surface on the cell back of the solar cell 2. One side of the film 3.1 protrudes beyond the cell edge of the solar cell 2.

For compensating the wafer thickness and for mechanical reinforcement, a contact element that is not illustrated here can be applied onto the protruding portion of the film, or the protruding portion of the film is folded without an additional contact element. All this can take place in an upstream pre-production process so that the metal film is already contacted with the back side of the solar cells before being arranged to form the cell combination and is therefore pre-assembled.

Subsequently, the prepared wafers are arranged in string or matrix form, and the thin wires in the form of first wire conductors 3, as in the preceding examples, are positioned as wire field F2 over the string/the matrix and are contacted with the cell front of the solar cells and with the protruding portion of the film 3.1 of the adjacent cell.

Analogous to the aforementioned illustrative embodiments, gaps 7 are also generated.

Figure 10K:
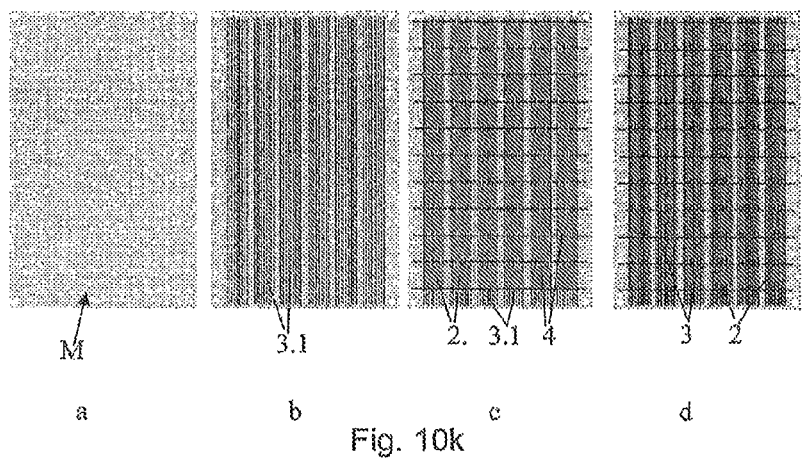
FIG. 10k shows the work steps start with an empty carrier, pulling out the back side wires, placing the cells, pulling out the cross-connectors, and pulling out the front side wires.
Figure 10L:
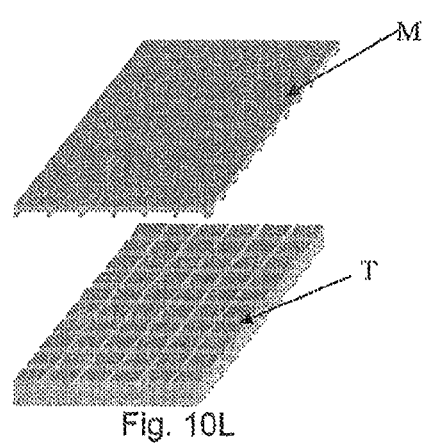
FIG. 10l shows the transport of the carrier generated on the matrix plate to the heating plate T.

Furthermore, it is possible to position the wire electrodes and the solar cells 2 first on a movable matrix carrier M in a first work station (FIG. 10k). Said matrix carrier is ideally made of a material that has a high thermal conductivity and low heat capacity, e.g., made of anodized aluminum. FIG. 10k shows from left to right the work steps a) start with empty matrix carrier M, b) pulling out the back side wires in the form of a multiplicity of thin second wire conductors 3.1 (second electrode) which are aligned substantially parallel to each other, c) placing the cells 2 over the second wire conductors 3.1 and pulling out the cross-connectors 4 in each case between two adjacent cells and perpendicular to the second wire conductors 3.1, and d) pulling out the front side wires in the form of a multiplicity of first wire conductors 3 (first electrode) over the upper sides of the solar cells 2 and the matrix carriers M produced in this manner. The first and the second wire conductors 3, 3.1 are arranged parallel to each other and are aligned here one above the other, and are present in the same quantity.

With this variant it is possible in only one step to contact the matrix of solar cells, wire conductors and cross-connectors which, for the time being, are only horizontally positioned relative to each other, wherein said matrix is received in the matrix carrier M.

An assumed time per step of in each case 5 s for pulling out the electrodes (wire conductors 3, 3.1) and the cross-connectors 4, and of 1 s for each solar cell 2 results in a processing time of only 75 s in the first work station. Cells, electrodes and cross-connectors are fixed through optionally vertically movable positioning aids, and the electrodes and cross-connectors are held at their ends by means of suitable clamping devices.

Subsequently, the matrix carrier M loaded according to FIG. 10, illustration d, is transferred from the first work station to a second work station. The latter is characterized by a structured heating plate T into which negative structure elements on the back side of the matrix carrier fit, see FIG. 10L. By structuring the heating plate T and the matrix carrier M, the latter can be made very thin and thus in a highly heat-conducting manner underneath the solar cells—possibly facilitated by a black anodized layer—while the webs on the back side ensure the necessary mechanical stiffness and also increase the surface area for the heat transfer.

The heating plate T is heated to a temperature close to but below the melting temperature of the solder. After a short heating period, the electrodes are soldered together with the solar cells and the cross-connectors and as a result, contacting of a multiplicity of solar cells with first and second wire conductors and cross-connectors is established in only one step. Of course, instead of a multiplicity of thin second wire conductors, a few metal bands or a metal film can also be used as a second electrode.

Depending on the required time, separating the electrodes (wire conductors 3, 3.1) can already be carried out in the second work station, e.g., parallel to or with a delay to the soldering process. Subsequently, the matrix carrier is transported to a non-illustrated third work station.

The latter can be provided with a cooling plate analogous to the second work station so as to accelerate cooling of the matrix carrier. In this work station—if not carried out in station 2—separating the wire fields takes place.

In the case that the above-mentioned positioning aids and clamping devices can be retracted (e.g. spring-loaded into the stiffening structure elements on the back side of the carrier) or are located considerably outside of the matrix, the embedding material (e.g., EVA) and the module glass plate can subsequently be deposited and fixed on the carrier. Thereafter, the carrier together with the matrix, the embedding material and the glass is turned, the fixation of the glass is released and the carrier is lifted. For further processing, the module glass plate is then further treated in a conventional manner (e.g., applying the second layer of EVA and the back film and laminating). Through this it is avoided that the matrix has to be transported by means of grippers, vacuum suction cups or Bernoulli grippers.

An advantage of this arrangement is the parallelization of the time-consuming work steps such as the cell positioning and the soldering process. This also reduces the residence time on the heating plate. The cell matrix together with the sensitive solder joints and the thin electrodes are always supported by the matrix carrier or, in the further course, by the glass plate.

Depending on the embodiment, the first and/or second wire conductors are separated between the solar cells after contacting in the matrix carrier so that the desired interconnection is created. This is preferably carried out in the matrix carrier or in a further device with a suitable cutting/separating unit.

Figure 10M:
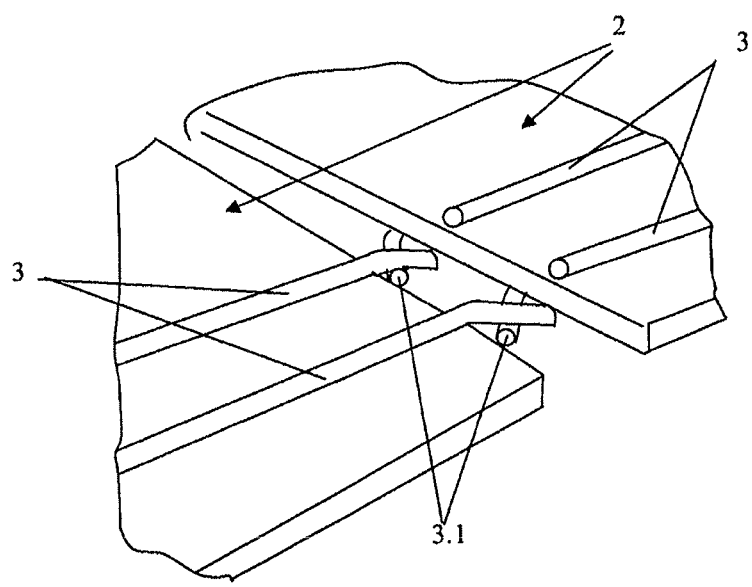
FIG. 10M shows an embodiment in which wire conductors are arranged on both sides of the solar cell.

In contrast to the aforementioned illustrative embodiments in which cross-connectors were used, it is also possible to connect and contact the first and second wire conductors 3, 3.1 directly to each other; this is carried out mechanically in that the wire conductors 3, 3.1 are fed to each other and, e.g., are bent and connected to each other, e.g., by crimping or soldering. This preferably takes place in the still spanned state of the wire conductors 3, 3.1. However, it is also possible to establish the direct connection between the first and second wire conductors after they have been separated for a suitable interconnection. FIG. 10M shows an illustrative embodiment in which the first and second wire conductors 3, 3.1, which are arranged on both sides of the solar cell 2, have been directly connected to each other and have been provided with suitable gaps 7 by separating the wire conductors. This variant has the advantage that the cross-connectors can be eliminated.

The FIGS. 11 to 18 illustrate the method steps and a device for producing a further variant of a solar cell combination 1 from solar cells 2 by using first wire conductors 3 which run alternately between the upper side and the lower side of the solar cells 2 and using further contact elements in the form of second wire conductors 3.1 which are parallel to the first wire conductors 3 and which run alternately opposite to the first wire conductors 3 between the lower sides and the upper sides of the solar cells 3.

Figure 11:
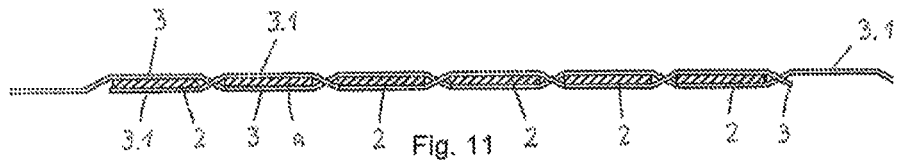
Figure 12:
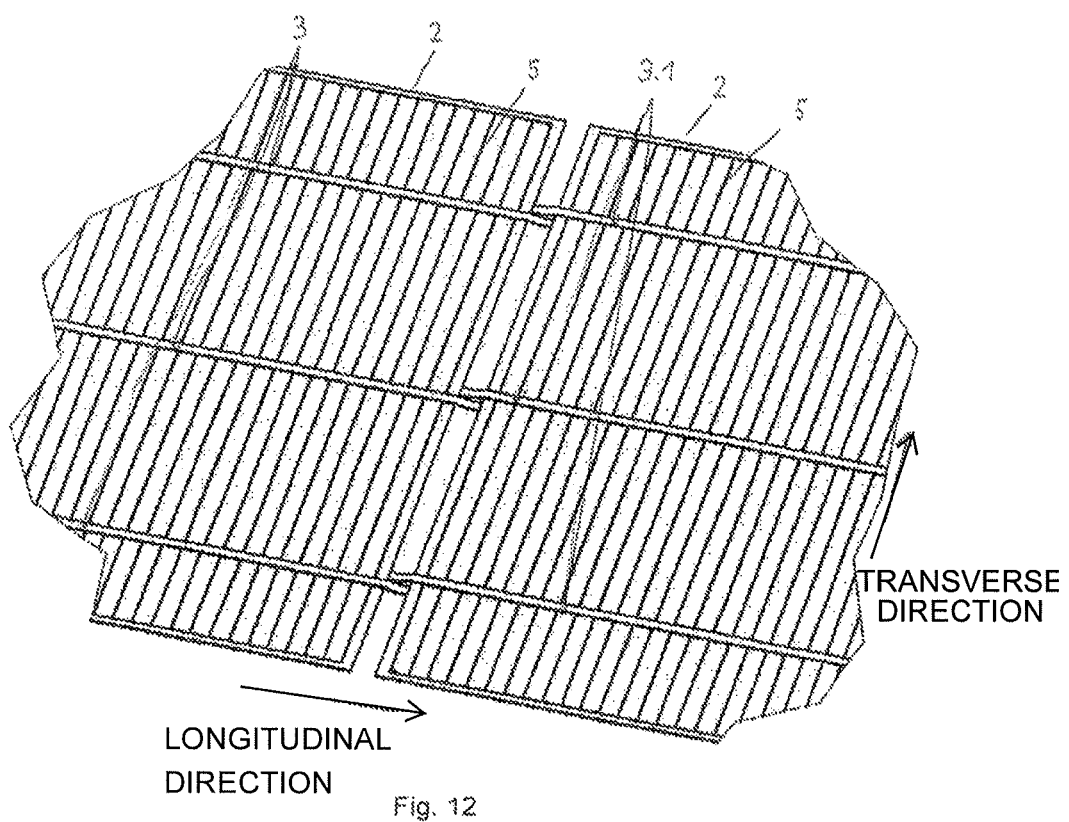
Figure 13:
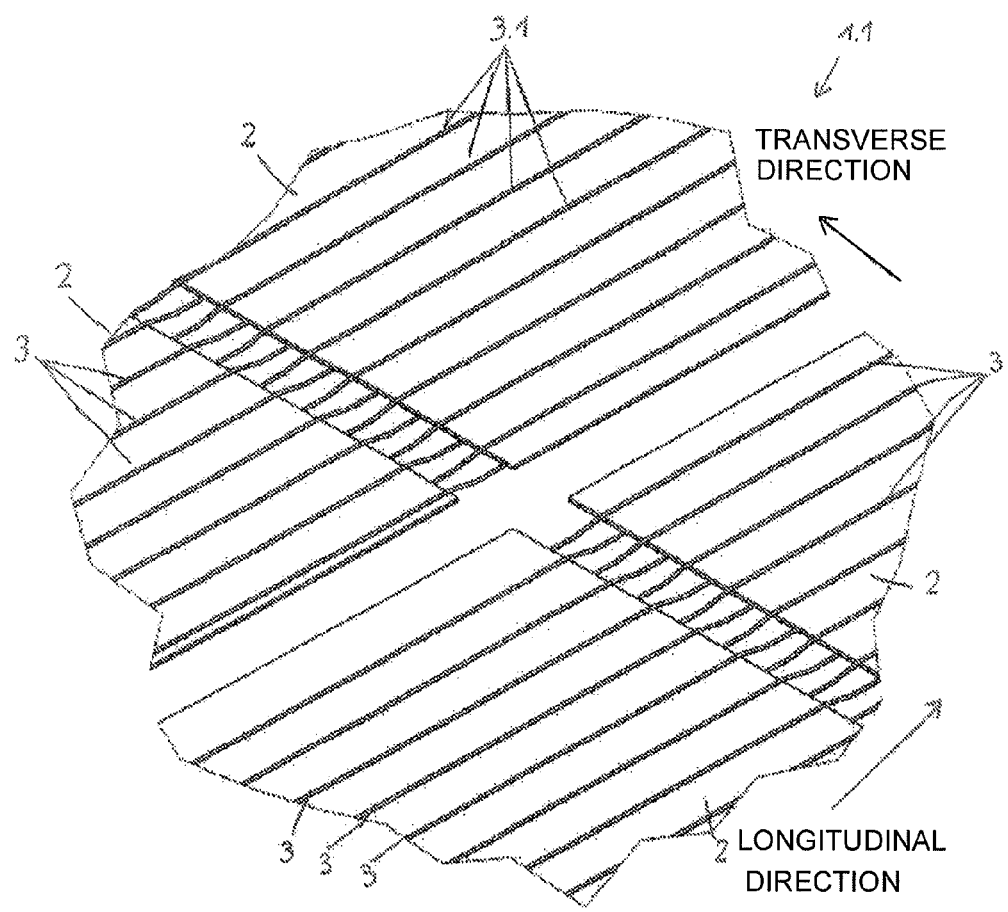

FIG. 11 illustrates the longitudinal section of solar cells 2 arranged one behind the other and next to each other, wherein a continuous first wire conductor 3 runs over the upper side and the lower side of the adjacent solar cells 3, and the continuous second wire conductor 3.1 runs opposite thereto between the lower side and the upper side of the adjacent solar cells 2, and the three-dimensional view according to FIG. 11 is illustrated from above in FIG. 12. The solar cells are provided on their upper side with strip connectors 5 which are printed thereon transverse to the first and second wire conductors. FIG. 13 illustrates an intermediate combination 1.1 on which no strip connectors are printed, as a result of which the manufacturing complexity is decreased and costs are considerably reduced. After the solar cells were combined with the first and second wire conductors to form an intermediate combination 1.1 and were contacted by soldering, it is required, as in variant 2, to separate the wire conductors according to the desired interconnection so that the desired solar cell combination is created.

Figure 14:
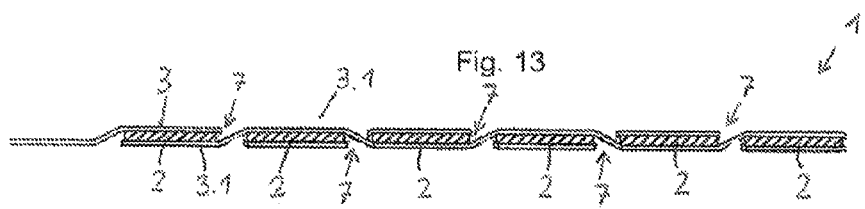

FIG. 14 shows a longitudinal section and FIG. 15 shows the three-dimensional view of solar cells 2 arranged one behind the other and next to each other, wherein alternately between successively arranged solar cells 2, the first and second wire conductors 3, 3.1 were separated so that through the gaps 7 generated during separating (preferably by means of laser), a series connection is formed and the desired solar cell combination 1 is created.

FIG. 16 illustrates the three-dimensional view of a string S produced according to variant 3 with solar cells 2 which were contacted with only one first and one second wire conductor 3, 3.1. Here too, there are gaps 7 due to the separation of the wire conductors 3, 3.1 and as a result, a series connection has been implemented.

Figure 17:
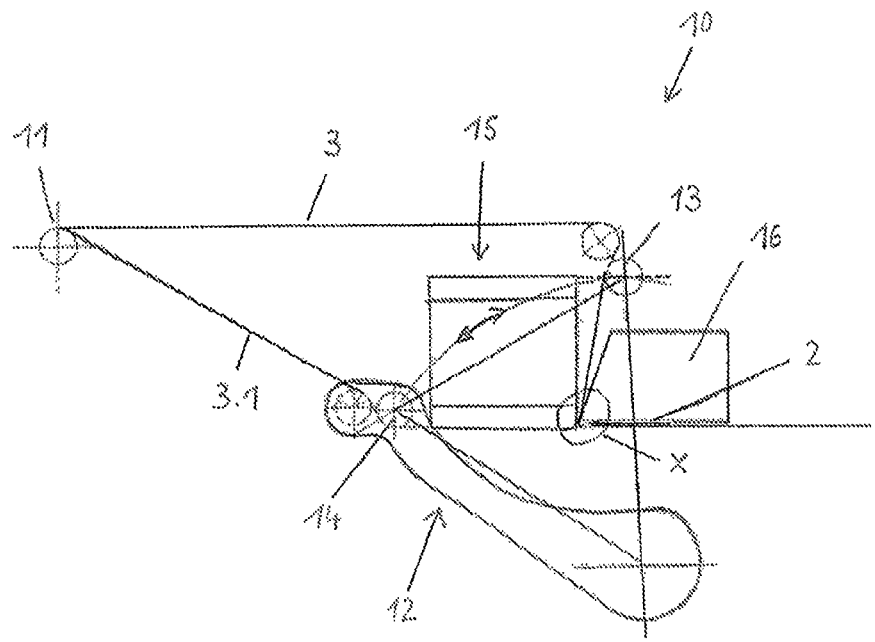
Figure 18:
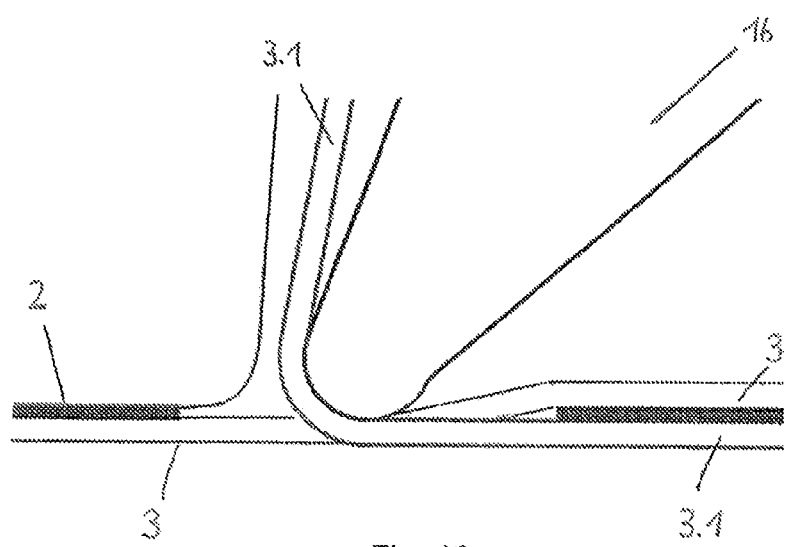

FIG. 17 shows the schematic diagram of a device 10 for producing a solar cell combination or an intermediate combination according to variant 3, and the detail according to FIG. 17 is shown in FIG. 18. Through a first roll feeder, a multiplicity of first wire conductors 3 arranged next to each other and a multiplicity of wire conductors 3.1 arranged therebetween are fed to the weaving device 12. The wire conductors 3, 3.1 are alternately moved upward and downward according to the arrow by means of weaving rolls 13, 14. In each case inbetween, a row of a plurality of solar cells 2 is inserted by means of a cell handling device 15 and moved in the transport direction and subsequently, the first and second wire conductors 3, 3.1 are spanned around. In order to avoid breakage of the solar cells, a downholder 16 is provided which keeps the wire conductors 3, 3.1 in the extension plane of the solar cells 2 during the weaving process.

It is possible with all three variants to produce a solar cell combination that forms a complete solar cell module or comprises a multiplicity of solar cell modules and is then separated into individual modules.

With the solution according to the invention, the production of solar cell modules is revolutionized.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations within the scope of the appended claims and equivalents thereof.

The invention claimed is:

1. A method for contacting and connecting solar cells by at least two independent electrodes, wherein at least one electrode is formed from at least one continuous wire conductor, comprising the following steps:

positioning the at least one continuous wire conductor so that said wire conductor extends across a plurality of solar cells, disconnecting the at least one wire conductor at positions between adjacent solar cells to form the at least one electrode after the at least one wire conductor has been extended across the plurality of solar cells and prior to fixing the plurality of solar cells under a glass plate, establishing electrical contact between the solar cells and the at least two electrodes, and establishing electrical contact between the at least two electrodes via bonding prior to disconnecting the electrodes.

2. The method according to claim 1, wherein contacting the electrodes with the solar cells takes place prior to disconnecting the electrodes.

3. The method according to claim 1, wherein said method is carried out with the following steps:

arranging a first electrode on the light incidence side of a plurality of solar cells, wherein the first electrode is formed from a multiplicity of wire conductors which are substantially parallel to each other and which extend across at least two adjacent solar cells, contacting the wire conductors of the first electrode with a second electrode on the back side of the adjacent solar cell, disconnecting the wire conductors of the first electrode and/or the second electrode between the contact point of the first and second electrodes and the edge of the adjacent solar cell.

4. The method according to claim 1, wherein the electrodes are connected/contacted with each other through contact elements/cross-connectors.

5. The method according to claim 4, wherein arranging the contact element/cross-connector takes place substantially perpendicular to the alignment of the wire conductors of the first electrode and in the space between two adjacent solar cells and also between the first and the second electrodes.

6. The method according to claim 1, wherein the ends of the first and/or second wire conductors and/or cross-connectors are provided with electrical collecting connectors.

7. The method according to claim 1, wherein establishing the contacting is carried out without printing bars onto the solar cell.

8. A method for contacting and connecting solar cells by at least two independent electrodes, wherein at least one electrode is formed from at least one continuous wire conductor, comprising the following steps:

positioning the at least one continuous wire conductor so that said wire conductor extends across a plurality of solar cells, disconnecting the at least one wire conductor at positions between adjacent solar cells to form the at least one electrode after the at least one wire conductor has been extended across the plurality of solar cells and prior to fixing the plurality of solar cells under a glass plate, establishing electrical contact between the solar cells and the at least two electrodes, and establishing electrical contact between the at least two electrodes via bonding prior to disconnecting the electrodes, wherein in a manner as continuous as possible, a plurality of solar cells are connected to at least one first wire conductor of the at least one continuous wire conductor that runs continuously in the longitudinal direction of successively arranged solar cells, or are connected to a group of said first wire conductors and are connected to at least one continuously running further contact element or to a group of further contact elements so as to form together a solar cell combination, and an electrical connection is established between the at least one first wire conductor, the further contact elements and the solar cells of the solar cell combination, and if required, the at least one first wire conductor and/or the second contact elements are separated before or after establishing the electrical connection in such a manner that a series connection is created or can be established.

9. A method for contacting and connecting solar cells by at least two independent electrodes, wherein at least one electrode is formed from at least one continuous wire conductor, and the electrodes are connected/contacted with each other through contact elements/cross-connectors, wherein the at least one first wire conductor of the first electrode are contacted on an upper side (light incidence side) of a plurality of solar cells, and further contact elements are configured in the form of electrical cross-connectors which run transverse to the at least one first wire conductor between adjacent solar cells and which are applied to the at least one first wire conductor conductors and are connected thereto, and subsequently the at least one first wire conductor is separated, transverse to their longitudinal extension, between adjacent solar cells, and a region protruding beyond the solar cells and provided with the cross-connectors is connected to the lower side of the adjacent solar cells so that the two cross-connectors rest against the lower side of the adjacent solar cells.

10. The method according to claim 9, wherein the at least one first wire conductor of the first electrode is contacted on the upper light incidence side of the solar cells, and wherein at least one second wire conductor is contacted on a lower side of the solar cells substantially parallel to the at least one first wire conductor, and the first and the second wire conductors are connected to each other through the electrical cross-connectors.

11. The method according to claim 10, wherein the cross-connectors run between the first and the second wire conductors.

12. The method according to claim 10, wherein the connection of the first and the second wire conductors to the cross-connector are in each case alternately disconnected so that a series connection is created.

* * * * *